United States Patent [19]
Brown

[11] Patent Number: 5,999,469
[45] Date of Patent: Dec. 7, 1999

[54] SENSE TIME REDUCTION USING MIDLEVEL PRECHARGE

[75] Inventor: Jeff S. Brown, Fort Collins, Colo.

[73] Assignee: LSI Logic Corporation, Milpitas, Calif.

[21] Appl. No.: 09/034,965

[22] Filed: Mar. 4, 1998

[51] Int. Cl.$^6$ ................................ G11C 7/00; G11C 7/02
[52] U.S. Cl. ............................................ 365/203; 365/207
[58] Field of Search ................................ 365/203, 205, 365/207, 208, 190

[56] References Cited

U.S. PATENT DOCUMENTS

| | | | |
|---|---|---|---|
| 4,567,387 | 1/1986 | Wacyk | 365/203 |
| 4,725,986 | 2/1988 | Kouba | 365/203 |
| 4,888,737 | 12/1989 | Sato | 365/203 |
| 4,893,276 | 1/1990 | Okuyama | 365/189.08 |
| 4,988,888 | 1/1991 | Hirose et al. | 307/443 |
| 4,996,671 | 2/1991 | Suzuki et al. | 365/203 |
| 5,058,072 | 10/1991 | Kashimura | 365/203 |
| 5,204,838 | 4/1993 | Son et al. | 365/203 |
| 5,309,401 | 5/1994 | Suzuli et al. | 365/203 |
| 5,377,149 | 12/1994 | Gaultier | 365/203 |
| 5,418,749 | 5/1995 | Suda et al. | 365/203 |
| 5,600,601 | 2/1997 | Murakami et al. | 365/203 |
| 5,636,169 | 6/1997 | Oh | 365/203 |
| 5,808,950 | 9/1998 | Suzuki | 365/203 |

*Primary Examiner*—Trong Phan

[57] ABSTRACT

A network in a memory device for selecting a bit line during a data read or a data write. The network includes a first bit line in communication with a bitcell and a second bit line in communication with the bitcell. A charger is in communication with the first and second bit lines, and the charger is configured to charge the first bit line to a first charged level and the second bit line to a second charged level before a data read or a data write. A sensor is connected to the first and second bit lines. The bitcell drives one bit line up and the other bit line down during a data read. The sensor senses a difference between the first and second bit lines to select one of the first and second bit lines during a data read.

23 Claims, 2 Drawing Sheets

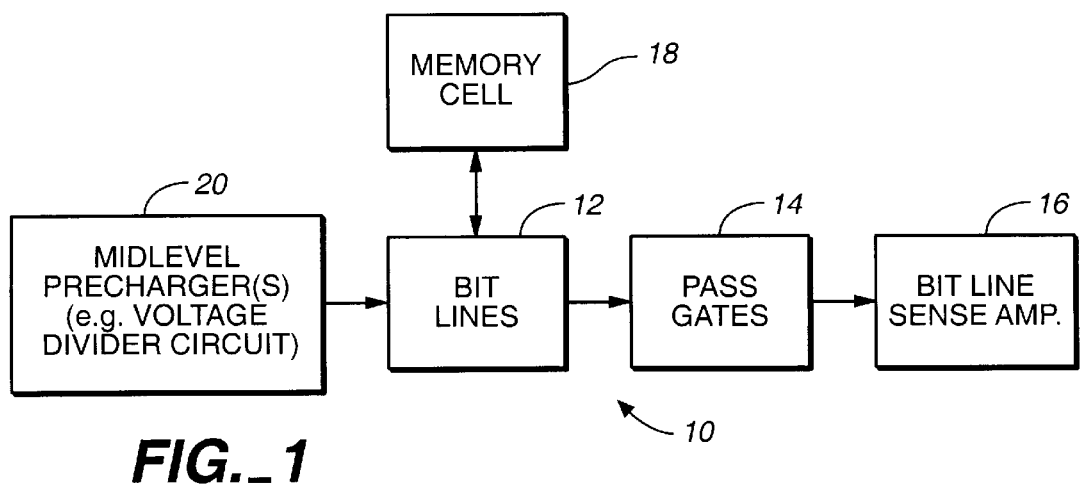
FIG._1
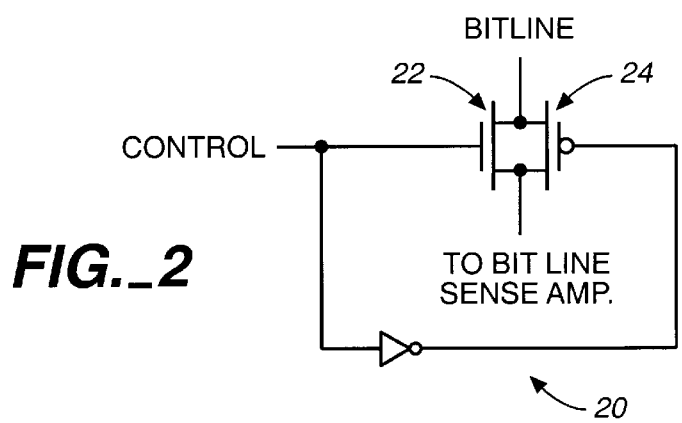
FIG._2
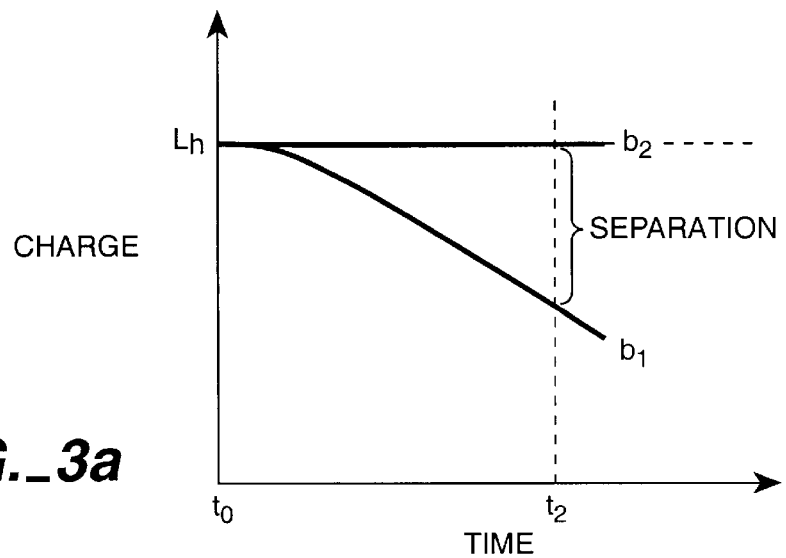
FIG._3a

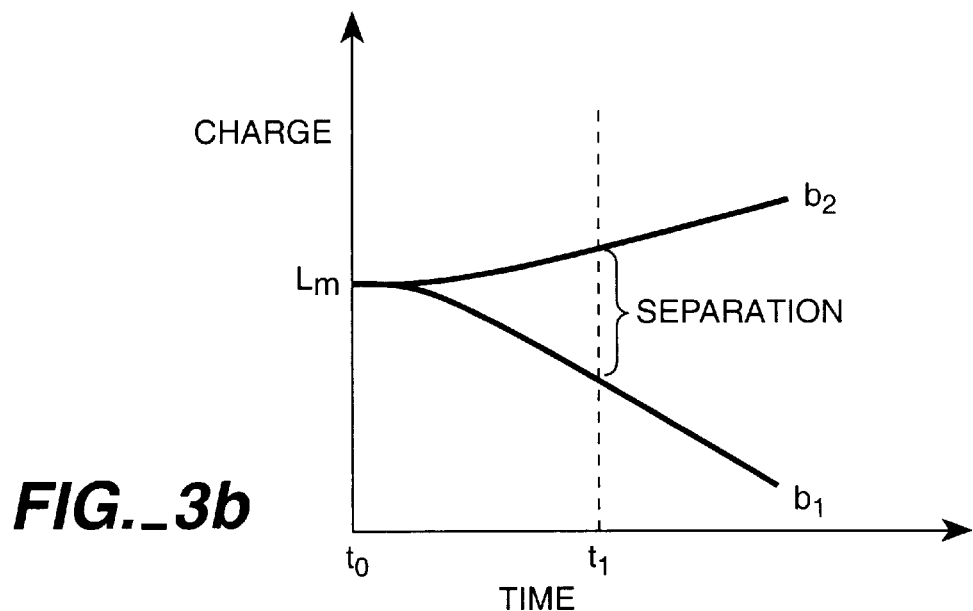
FIG._3b
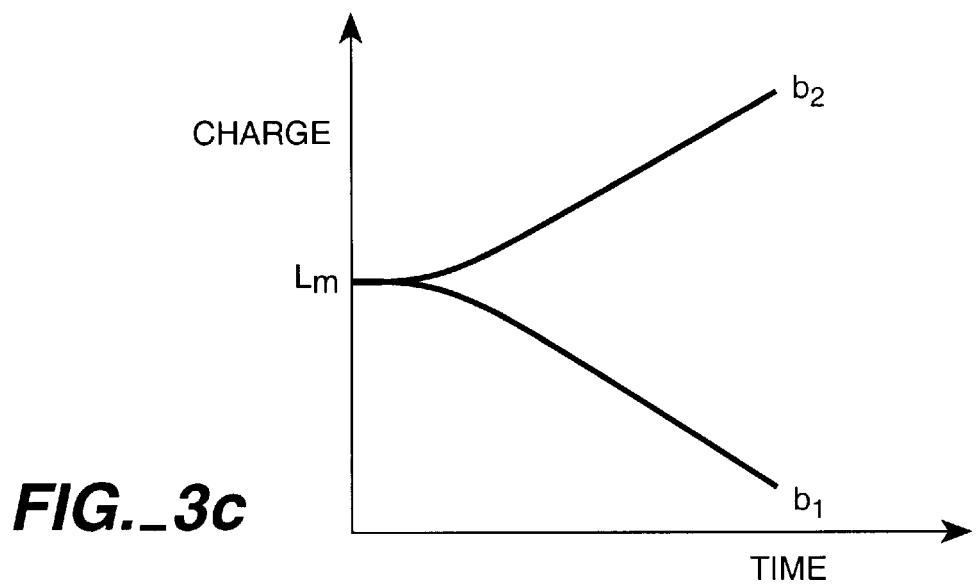
FIG._3c

SENSE TIME REDUCTION USING MIDLEVEL PRECHARGE

The present invention relates generally to networks in memory devices for selecting a bit line, and more specifically relates to a network in a memory device which utilizes a midlevel precharge to reduce sense time.

BACKGROUND OF THE INVENTION

A typical semiconductor memory device includes a plurality of memory cells or bitcells arranged in arrays, and a memory cell selector means for enabling the selection of a particular memory cell to facilitate the reading of data from, or the writing of data to, that particular memory cell.

For example, a high density dynamic random access memory (DRAM) includes a plurality of core cell blocks, and each core cell block contains several memory cells. The memory cells are metal-oxide semiconductor field-effect transistors (MOSFETs), and each MOSFET acts as a switch. To this end, each pair of MOSFETs is connected to a pair of bit lines (an input/output or I/O port), and the capacitance of each MOSFET can be charged by data. While one of the bit lines is the data itself, the other bit line is the complement data.

A bit line sense amplifier is provided in communication with a pair of bit lines corresponding to a set of memory cells. Each bit line sense amplifier amplifies the data which is read from the corresponding memory cell through the bit line pair or I/O port.

To select a memory cell, a memory column and row address is provided to the DRAM from outside the DRAM. A column decoder decodes this column address which is received from outside the DRAM, and then provides a signal to the corresponding bit line sense amplifier which selects the proper bit line pair therefore selecting the corresponding memory cell which corresponds thereto.

Before a typical read or write cycle, both bit lines of a memory cell are precharged to a relatively high level. Then, during the data read, the memory cell drives the bit lines. As one of the bit lines goes down, the other bit line remains relatively stable. As the one bit line falls, the bit line sense amplifier compares the two bit lines and senses which bit line has a higher charge. The time it takes to determine which bit line has the higher level is the sense time.

It is desirable to provide that the bit line sense amplifier can quickly determine which bit line has the higher level and therefore select the correct bit line or data value. As a result of being able to quickly determine which bit line has the higher charge, data sense time is minimized. When a data read is performed, the bit line which loses charge often falls slowly. This can, for example, be due to high capacitance in the memory array (often caused by a high row count) and the low drive of the memory cell due to its relatively small size. As a result of the falling bit line not falling quickly and the bit line sense amplifier attempting to sense a difference between a stable bit line and a slowly falling bit line, the time in which it takes the bit line sense amplifier to select the correct data value is not minimized. As a result, data sense time is not minimized.

OBJECTS AND SUMMARY

It is an object of the present invention to reduce data sense time in a memory device.

It is a further object of the present invention to precharge bit lines in a memory device to an intermediate level such that one bit line is driven up and the other is driven down during a data read.

It is a further object of the present invention to provide an optimized network in a memory device for quickly transferring data from the memory array bit lines to the bit line sense amplifier inputs.

In accordance with these and other objects, the present invention provides a network in a memory device for selecting a bit line during a data read or a data write. The network includes a first bit line in communication with a bitcell and a second bit line in communication with the bitcell. A charger is in communication with the first and second bit lines, and the charger is configured to charge the first bit line to a first charged level and the second bit line to a second charged level before a data read or a data write. A sensor is connected to the first and second bit lines. The bitcell drives one bit line up and the other bit line down during a data read. The sensor senses a difference between the bit lines to select one of the bit lines during a data read.

Preferably, the charger is a voltage divider circuit configured to charge the bit lines to a substantially equal, intermediate level before a data read or a data write and the sensor is a bit line sense amplifier. Between the bit lines and the bit line sense amplifier is a device which has a component which readily allows high values to pass therethrough and a component which readily allows low values to pass therethrough. The device is preferably two complementary metal-oxide silicon field-effect transistors integrated into a single chip.

Another aspect of the present invention provides a method of selecting a bit line in a memory device during a data read or a data write. The method includes the steps of providing a first and second bit line in communication with a bitcell; charging the first bit line to a first charged level and the second bit line to a second charged level before a data read or a data write; driving one bit line up and the other bit line down during a data read; and sensing a difference between the bit lines to select one of the bit lines.

Preferably, the first bit line is charged to the first charged level and the second bit line is charged to the second charged level using a voltage divider circuit in communication with the bit lines. The first bit line and second bit lines are charged to a substantially equal level before a data read or a data write. The difference between the charged levels of the bit lines is preferably sensed using a bit line sense amplifier in communication with the bit lines. A device is provided in communication with the bit lines, between the bit lines and the bit line sense amplifier, and the device includes a component which allows high values to pass therethrough and a component which allows low values to pass therethrough. Desirably, the device is two complementary metal-oxide silicon field-effect transistors integrated into a single chip.

By providing that the bit lines are charged to a level before a data read or write such that one bit line is driven up and the other bit line is down during a data read, read access times are reduced. By providing two complementary metal-oxide silicon field-effect transistors between the bit lines and the bit line sense amplifier, both low and high values can pass well thereby providing for optimization of a data read as the bit lines move apart.

BRIEF DESCRIPTION OF THE DRAWINGS

The present invention and the advantages thereof will become more apparent upon consideration of the following detailed description when taken in conjunction with the accompanying drawings of which:

FIG. 1 is a schematic diagram of a portion of a network in a memory device in accordance with an embodiment of the present invention;

FIG. 2 is a schematic diagram of a pass gate which can be used in connection with the portion of the network shown in FIG. 1 in order to optimize the network illustrated;

FIG. 3a is a graph showing conventional bit line charge levels during a data read or data write;

FIG. 3b is a graph showing bit line charge levels during a data read or data write in accordance with the embodiment of the present invention illustrated in FIG. 1; and FIG. 3c is a graph showing bit line charge levels during a data read or data write as a result of employing the pass gate structure illustrated in FIG. 2 with the portion of the network shown in FIG. 1.

DETAILED DESCRIPTION OF AN EMBODIMENT OF THE INVENTION

FIG. 1 is a schematic diagram illustrating a portion of a network 10 within a memory device in accordance with an embodiment of the present invention. The memory device employing the portion of the network 10 may be a dynamic random access memory (DRAM) device.

As shown in FIG. 1, the network 10 includes bit lines 12 connected to pass gates 14 and to a bit line sense amplifier 16 or other type of sensor.

The bit lines 12 are also in communication with a memory cell 18 or bitcell. The bit lines 12 preferably consist of a pair where one bit line is the data itself of the memory cell 18, and the other bit line is the complement data. During a data read from the memory cell 18, the memory cell 18 drives the bit lines 12 at which time the pass gates 14 may pass the charge to the bit line sense amplifier 16. The bit line sense amplifier 16 compares the charge level of the bit lines 12 and senses which bit line has the higher charge. In order for the bit line sense amplifier 16 to sense which bit line has the higher charge, there must be at least a certain amount of separation between the bit lines 12.

The bit lines 12 are also connected to one or more midlevel prechargers 20, and the one or more midlevel prechargers 20 precharge the bit lines 12, before a data read or a data write, to an intermediate level or midlevel. The one or more midlevel prechargers 20 connected to the bit lines 12 may consist of a voltage divider circuit connected to each bit line where the voltage divider circuit is configured to charge the bit lines 12 to a midrail type of level. Preferably, both bit lines 12 of the pair are precharged by the voltage divider circuit before a data read or write such that both bit lines 12 are precharged to substantially the same intermediate level.

As mentioned, during a data read, the memory cell 18 drives the bit lines 12 thereby changing the charge of the bit lines 12. More specifically, the memory cell 18 pulls one of the bit lines up from the midlevel precharge level and the other bit line down from the midlevel precharge level. At this time of movement by the bit lines 12, the bit line sense amplifier 16 compares the charges of the bit lines 12 and attempts to determine which bit line has the higher charge.

As a result of the bit lines 12 being precharged to an intermediate level before a data read or write, and the bit lines 12 moving apart during a data read or write, the bit line sense amplifier 16 can quickly determine which bit line has the higher charge. This is because neither bit line is maintained at a substantially stable level while the other bit line moves. In contrast, both bit lines 12 move simultaneously apart from each other. Hence, the separation between the bit lines 12 grows more rapidly than if only one bit line were moving, and the bit line sense amplifier 16 can more quickly determine which bit line has the higher charge. This advantage can be seen by comparing FIG. 3a to FIG. 3b.

FIG. 3a illustrates conventional bit line separation between bit lines $b_1$ and $b_2$ during a data read or data write. As shown, initially, at time $t_0$, the bit lines are precharged to a high level ($L_h$). During the data read or data write, the one bit line, $b_1$ for example, is discharged and falls while the other bit line, $b_2$, remains stable. At time $t_2$, there is finally enough separation between the bit lines such that it can be determined which bit line, $b_1$ or $b_2$, has the higher charge.

In contrast, the embodiment of the present invention illustrated in FIG. 1 provides the bit line separation depicted in FIG. 3b during a data read or data write. Initially, at time $t_0$, the bit lines $b_1$ and $b_2$ (12 in FIG. 1) are precharged to an intermediate or midlevel ($L_m$). During the data read or data write, the one bit line, $b_1$ for example, is pulled down from the precharged midlevel $L_m$ while the other bit line $b_2$ is pulled up from the precharged midlevel $L_m$. At time $t_1$, there is enough separation between the bit lines such that it can be determined (for example, by the bit line sense amplifier 16 depicted in FIG. 1) which bit line, $b_1$ or $b_2$, has the higher charge. As a result of the bit lines moving apart during a data read or data write, more separation is obtained between the bit lines, and this separation is achieved within a shorter period of time. As a consequence, it can be determined more quickly which bit line, $b_1$ or $b_2$, has the higher charge, and data sense times are reduced ($t_1$ in FIG. 3b is less than $t_2$ in FIG. 3a).

Most memory devices are optimized to allow a bit line to fall and detect a falling bit line. For example, pass gates in most memory devices consist of n-channel devices. Therefore, the pass gates pass only low voltages well. If this type of pass gate is used in connection with the portion of the network illustrated in FIG. 1, the bit lines will move apart from each other, but the one bit line will fall relatively quickly while the other will rise at a somewhat slower rate. This is what is depicted in FIG. 3b.

However, the portion of the network 10 illustrated in FIG. 1 can be optimized to take advantage of the fact that the bit lines 12 are precharged to a midlevel and the fact that the bit lines 12 move apart upon a data read or data write. To provide this optimization, the pass gate structure 20 illustrated in FIG. 2 can be employed as the pass gate 14 in the portion of the network 10 depicted in FIG. 1. The pass gate structure 20 illustrated in FIG. 2 is preferably a true complementary metal-oxide semiconductor (CMOS) pass gate including complementary metal-oxide silicon field-effect transistors integrated into a single chip. Hence, the pass gate includes not only an n-channel device 22, but a p-channel device 24 as well. While the n-channel device 22 passes low values well, the p-channel device 24 will allow high values to pass through well.

The advantage of employing the pass gate structure 20 illustrated in FIG. 2 as the pass gates 14 in the portion of the network 10 depicted in FIG. 1 can be appreciated by viewing FIG. 3c and comparing same to FIG. 3b. FIG. 3c is a graph showing bit line charge levels during a data read or data write as a result of employing the pass gate structure 20 illustrated in FIG. 2 with the portion of the network 10 shown in FIG. 1. As shown, the bit line $b_2$ in FIG. 3c is pulled up more quickly from the precharged midlevel $L_m$ than the bit line $b_2$ of FIG. 3b. As a result, more bit line separation is obtained within a shorter period of time.

Therefore, by employing the pass gate structure 20 illustrated in FIG. 2 with the portion of the network 10 depicted in FIG. 1, the network 10 is optimized and which bit line, $b_1$ or $b_2$, has the higher charge can be more quickly determined. Consequently, data sense times are further reduced by employing the pass gate structure 20 illustrated in FIG. 2.

While a preferred embodiment of the present invention is shown and described, it is envisioned that those skilled in the art may devise various modifications of the present invention without departing from the spirit and scope of the appended claims.

What is claimed is:

1. A network in a memory device for selecting a bit line during a data read or a data write, said network comprising a first bit line in communication with a bitcell; a second bit line in communication with said bitcell; a charger in communication with said first and second bit lines, said charger configured to charge said first bit line to a first charged level and said second bit line to a second charged level before a data read or a data write; and a sensor connected to said first and second bit lines, said bitcell generally simultaneously driving said first bit line up from said first charged level and said second bit line down from said second charged level during a data read, said sensor sensing a difference between said first and second bit lines to select one of said first and second bit lines during a data read.

2. The network of claim 1, said memory device comprising a dynamic random access memory.

3. The network of claim 1, said charger comprising a voltage divider circuit.

4. The network of claim 1, said sensor comprising a bit line sense amplifier.

5. The network of claim 1, said charger configured to charge said first bit line and said second bit line to a substantially equal level before a data read or a data write.

6. The network of claim 1, further comprising a device between said bit lines and said sensor, said device allowing high values to pass therethrough.

7. The network of claim 6, said device comprising a p-channel device.

8. The network of claim 6, said device including a component which allows low values to pass therethrough.

9. The network of claim 8, said device comprising two complementary metal-oxide silicon field-effect transistors integrated into a single chip.

10. A method of selecting a bit line in a memory device during a data read or a data write, said method comprising: providing a first bit line in communication with a bitcell; providing a second bit line in communication with said bitcell; charging said first bit line to a first charged level and said second bit line to a second charged level before a data read or a data write; generally simultaneously driving said first bit line up from said first charged level and second bit line down from said second charged level during a data read; and sensing a difference between said first and second bit lines to select one of said first and second bit lines.

11. The method of claim 10, said memory device comprising a dynamic random access memory.

12. The method of claim 10, further comprising charging said first bit line to a first charged level and said second bit line to a second charged level using a voltage divider circuit in communication with the bit lines.

13. The method of claim 10, further comprising sensing said difference between said first and second bit lines using a bit line sense amplifier in communication with the bit lines.

14. The method of claim 10, further comprising charging said first bit line and said second bit line to a substantially equal level before a data read or a data write.

15. The method of claim 10, further comprising providing a device in communication with said bit lines, said device allowing high values to pass therethrough.

16. The method of claim 15, said device comprising a p-channel device.

17. The method of claim 16, said device including a component which allows low values to pass therethrough.

18. The method of claim 17, said device comprising two complementary metal-oxide silicon field-effect transistors integrated into a single chip.

19. A network in a dynamic random access memory for selecting a bit line during a data read or a data write, said network comprising a first bit line in communication with a bitcell; a second bit line in communication with said bitcell; a voltage divider circuit in communication with said first and second bit lines, said voltage divider circuit configured to charge said first bit line to a first charged level and said second bit line to a second charged level before a data read or a data write; and a bit line sense amplifier connected to said first and second bit lines, said bitcell generally simultaneously driving said first bit line up from said first charged level and said second bit line down from said second charged level during a data read, said bit line sense amplifier sensing a difference between said first and second bit lines to select one of said first and second bit lines during a data read.

20. The network of claim 19, further comprising a pass gate between said bit lines and said bit line sense amplifier, said pass gate allowing high values to pass therethrough.

21. The network of claim 20, said pass gate comprising a p-channel device.

22. The network of claim 20, said pass gate including a component which allows low values to pass therethrough.

23. The network of claim 22, said pass gate comprising two complementary metal-oxide silicon field-effect transistors integrated into a single chip.

* * * * *